United States Patent
Tsai et al.

(10) Patent No.: US 9,635,778 B2
(45) Date of Patent: Apr. 25, 2017

(54) MODULAR PROTECTIVE HOUSING STRUCTURE

(71) Applicant: AIC INC., Taoyuan Hsien (TW)

(72) Inventors: Kun-Sheng Tsai, Taoyuan Hsien (TW); Yong-Cong Chen, Taoyuan Hsien (TW)

(73) Assignee: AIC INC., Taoyuan (TW)

( * ) Notice: Subject to any disclaimer, the term of this patent is extended or adjusted under 35 U.S.C. 154(b) by 200 days.

(21) Appl. No.: 14/578,346

(22) Filed: Dec. 20, 2014

(65) Prior Publication Data
US 2016/0183403 A1 Jun. 23, 2016

(51) Int. Cl.
B65D 88/54 (2006.01)
H05K 7/18 (2006.01)
H05K 7/14 (2006.01)

(52) U.S. Cl.
CPC .......... H05K 7/18 (2013.01); H05K 7/1488 (2013.01)

(58) Field of Classification Search
CPC ..... H05K 5/0234; B65D 88/542; B65D 19/44
USPC ............... 220/1.5; 206/386; 108/55.1, 57.16
See application file for complete search history.

(56) References Cited

U.S. PATENT DOCUMENTS

| | | | | |
|---|---|---|---|---|
| 1,740,000 A * | 12/1929 | Andrews | ............... | B65D 88/542 105/377.05 |
| 5,762,222 A * | 6/1998 | Liu | ........................ | B65D 19/12 206/512 |
| 6,349,656 B1 * | 2/2002 | Mitchell | ............ | B65D 19/0087 108/53.1 |
| 8,152,014 B2 * | 4/2012 | Elstone, Sr. | ........... | B65D 19/12 220/4.28 |
| 8,251,467 B2 * | 8/2012 | Peng | .................... | H05K 5/0234 312/351.1 |
| 2002/0108540 A1 * | 8/2002 | Underbrink | ............ | B65D 19/42 108/55.3 |
| 2008/0000397 A1 * | 1/2008 | Dickinson | .............. | B65D 19/20 108/55.3 |
| 2012/0152798 A1 * | 6/2012 | Allegretti | ............... | B65D 19/06 206/599 |

* cited by examiner

*Primary Examiner* — J. Gregory Pickett
*Assistant Examiner* — Allan Stevens
(74) *Attorney, Agent, or Firm* — Chun-Ming Shih; HDLS IPR Services

(57) ABSTRACT

A modular protective housing structure for a rack includes a bottom portion of the rack having a plurality of rollers installed thereon; the module protective housing structure including a chassis having a base and an outer cover configured to surround the base thereon; the outer cover having a front opening; and a front door panel pivotally attached to the base; the front door panel configured to cover onto the front opening and placed on a ground; the front door panel having a plurality of slanted ribs attached to the ground; wherein when the front door panel is placed on the ground, the rack slides into the chassis from the ground along the front door panel, and positions of the slanted ribs are arranged corresponding to positions of the rollers. Therefore, effects of cost saving and supporting ability of the front door panel are achieved.

7 Claims, 6 Drawing Sheets

MODULAR PROTECTIVE HOUSING STRUCTURE

BACKGROUND OF THE INVENTION

Field of the Invention

The present invention is related to a protective housing for a server rack, in particular, to a modular protective housing structure.

Description of Related Art

As the needs for massive storages and computational data increase along with the development of the technology, servers and industrial computers are widely used in the industry. A conventional server or industrial computer typically includes a rack and a plurality of host machines divided into groups and stored in categories on the rack in order to save the space occupied and to facilitate the management by the management personnel.

Nevertheless, the servers or industrial computers are assembled prior to the shipping out to the market, followed by placing the servers and industrial computers into protective housings to be shipped to the user ends; in addition, the servers or industrial computers are delivered to the ground with the protective housings, and a slanted board is used for forming an oblique slope between the protective housings and the ground in order to allow the servers or industrial computers to slide to the ground via the slanted board. Therefore, there is a need to additionally equip a slanted board for each one of the servers or industrial computers during the shipping thereof. In cases where a customer purchasing a multiple number of servers and industrial computers at the same time, he or she would receive a multiple number of slanted boards, which causes wastes of materials and unfavorable concerns at the customer side.

In view of the above, the inventor seeks to overcome the problems associated with the currently existing technique after years of research and development along with the utilization of theoretical principles, and it is an objective of the inventor to provide a reasonable design and an improvement capable of effectively solve the aforementioned problems.

SUMMARY OF THE INVENTION

An objective of the present invention is to provide a modular protective housing structure capable of using a front door panel for replacing the known slanted board in order to achieve the effect of cost saving. In addition, the front door panel includes slanted ribs extended therefrom and attached to the ground, and the positions of the slanted ribs are arranged corresponding to the positions of the rollers in order to further increase the supporting ability of the front door panel.

To achieve the aforementioned objective, the present invention provides a modular protective housing structure for a rack; a bottom portion of the rack having a plurality of rollers installed thereon; the module protective housing structure comprising: a chassis comprising a base and an outer cover configured to surround the base thereon; the outer cover having a front opening; and a front door panel pivotally attached to the base; the front door panel configured to cover onto the front opening and placed on a ground; the front door panel having a plurality of slanted ribs attached to the ground; wherein when the front door panel is placed on the ground, the rack slides into the chassis from the ground along the front door panel, and positions of the plurality of slanted ribs are arranged corresponding to positions of the plurality of rollers.

The present invention further includes the following advantageous effects:

First, the front door panel is used to replace the known slanted board additionally required for shipping such that it is able to prevent the customer purchasing a multiple servers or industrial computers from receiving a multiple number of slanted boards in order to achieve the effect of cost saving.

Second, when the rack slides to the front door panel, the positions of the rollers are on top of the positions of the slanted ribs in exact such that the slanted ribs are able to stably withstand the weight of the chassis supported in order to increase the supporting ability of the front door panel.

Third, the modular protective housing structure further comprises a plurality of latch assemblies in order to allow the front door panel and the outer cover to be covered onto each other via a latch method.

Fourth, the rear end of the front door panel includes a flat surface for attaching onto the ground in order to increase the surface area of the front door panel attaching onto the ground such that the weight of the rack can be uniformly distributed onto the ground via the surface area of the front door panel attaching to the ground.

Fifth, the modular protective housing structure further comprises an anti-tipping plate; one side of the anti-tipping plate is secured onto the base and another side thereof is secured onto the rack in order to allow the rack to be firmly secured onto the base such that it is able to prevent the occurrences of tipping over and collisions of the rack during the shipping thereof.

DETAILED DESCRIPTION OF THE INVENTION

Figure 1:
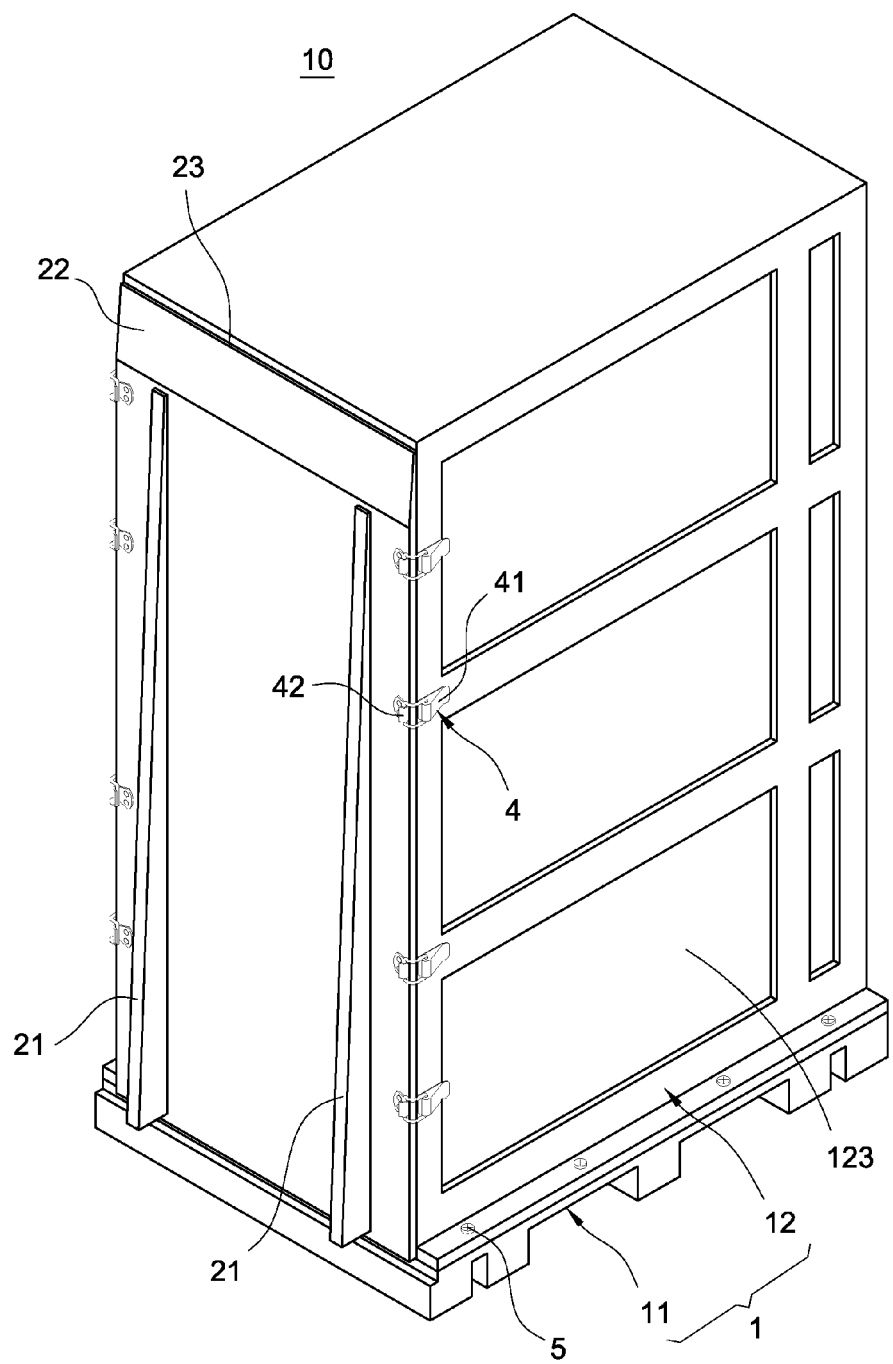
FIG. 1 is a perspective assembly view of a modular protective housing structure of the present invention.

The following provides a detailed description and technical content of the present invention along with the accompanied drawings. However, the accompanied drawings are provided for illustrative purposes only, which shall not be treated as limitations of the present invention.

As shown in FIG. 1 to FIG. 5, the present invention provides a modular protective housing structure for a rack 100; the rack 100 is used for carrying a server or an industrial computer; a bottom portion of the rack 100 includes a plurality of rollers 101 installed thereon. The modular protective housing structure 10 mainly comprises a chassis 1 and a front door panel 2.

The chassis 1 comprises a base 11 and an outer cover 12 configured to surround the base 11 thereon. A perimeter of the base 11 includes a plurality of first fixation holes 111. The outer cover 12 includes a front opening 121 and a plurality of second fixation holes 122 disposed on a perimeter thereof In addition, the outer cover 12 includes a plurality of side plates 123, and the base 11 includes a positioning protruded strip 112 cooperating with the side plates 123. Each side plate 123 is blocked and positioned by the positioning protruded strip 112. The following provides details of the present invention but is not limited to such configuration only. A quantity of the side plate 123 is three and circumference together to form a U shape plate; the positioning protruded strip 112 is also formed into a U-shape protruded strip cooperating with the side plates 123; the U-shape plates are blocked and positioned by the U-shape protruded strip.

The front door panel 2 is pivotally attached to the base 11. The front door panel 2 is able to cover onto the front opening 121 or to be placed on the ground. The front door panel 2 includes a plurality of slanted ribs 21 extended therefrom and attached to the ground. A thickness of each slanted rib 21 gradually decreases toward a direction away from the base 11.

In addition, a rear end of the front panel 2 includes a flat surface 22 for attaching onto the ground. Each slanted rib 21 is configured between the base 11 and the flat surface 22.

The following provides a description of further details. A rear end of the front door panel 2 includes a slanted section 23 having a thickness gradually decreased toward a direction away from the base 11. The flat surface 22 is formed on the slanted section 23.

Furthermore, one side of the front door panel 2 away from each slanted rib 21 includes a track 24. The rack 100 slides on the track 24, and the track 24 comprises two guiding ribs 25 extended form the front door panel 2.

Accordingly, when the front door panel 2 is placed on the ground, the rack 100 is able to slide into the chassis 1 from the ground along the front door panel 2, and the positions of the slanted ribs 21 are arranged corresponding to the positions of the rollers 101.

The modular protective housing structure 10 of the present invention further comprises a plurality of hinge members 3. Each hinge member 3 includes one end connected to the base 11 and another end connected to the front door panel 2 in order to allow the front door panel 2 to be pivotally attached to the base 11.

The modular protective housing structure 10 of the present invention further comprises a plurality of latch assemblies 4. Each latch assembly 4 comprises a latch ring 41 and a latch hook 42. Each latch ring 41 is secured onto the outer cover 12, and each latch hook 42 is secured onto the front door panel 2. Each latch ring 41 can be latched onto each hook 42 correspondingly.

The modular protective housing structure 10 of the present invention further comprises a plurality of screws 5. Each screw 5 is fastened onto each first fixation hole 111 and each second fixation hole 122 in order to allow the outer cover 12 to be secured onto the base 11 via a fastening method.

For the assembly of the modular protective housing structure 10 of the present invention, it uses the chassis 1 comprising the base 11 and the outer cove 12 configured to surround the base 11 thereon; the outer cover 12 includes a front opening 121; the front door panel 2 is pivotally attached to the base 11; the front door panel 2 is able to cover onto the front opening 121 or to be placed on the ground; the front door panel 2 includes slanted ribs 21 extended therefrom and attached to the ground; wherein when the front door panel 2 is placed on the ground, the rack 100 is able to slide into the chassis 1 from the ground along the front door panel 2; and the positions of the slanted ribs 21 are arranged corresponding to the positions of the rollers 101. Therefore, the front door panel 2 is used to replace the known slanted board in order to achieve the effect of cost saving. Furthermore, since the front door panel 2 includes the slanted ribs 21 extended therefrom and attached to the ground in addition to that the positions of the slanted ribs 21 are arranged corresponding to the positions of the rollers 101, the supporting ability of the front door plate 2 is increased.

Figure 4:
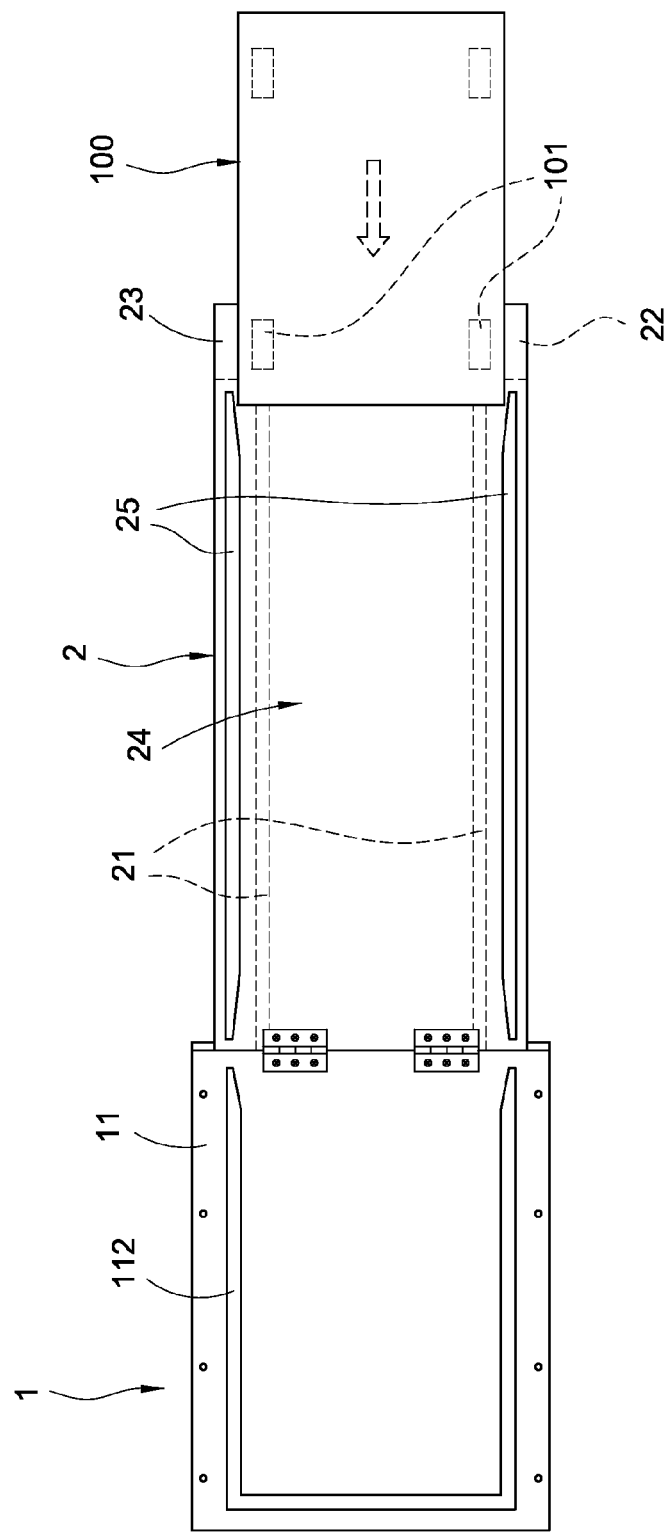
FIG. 4 is an illustration showing a state of use of the modular protective housing structure of the present invention.
Figure 5:
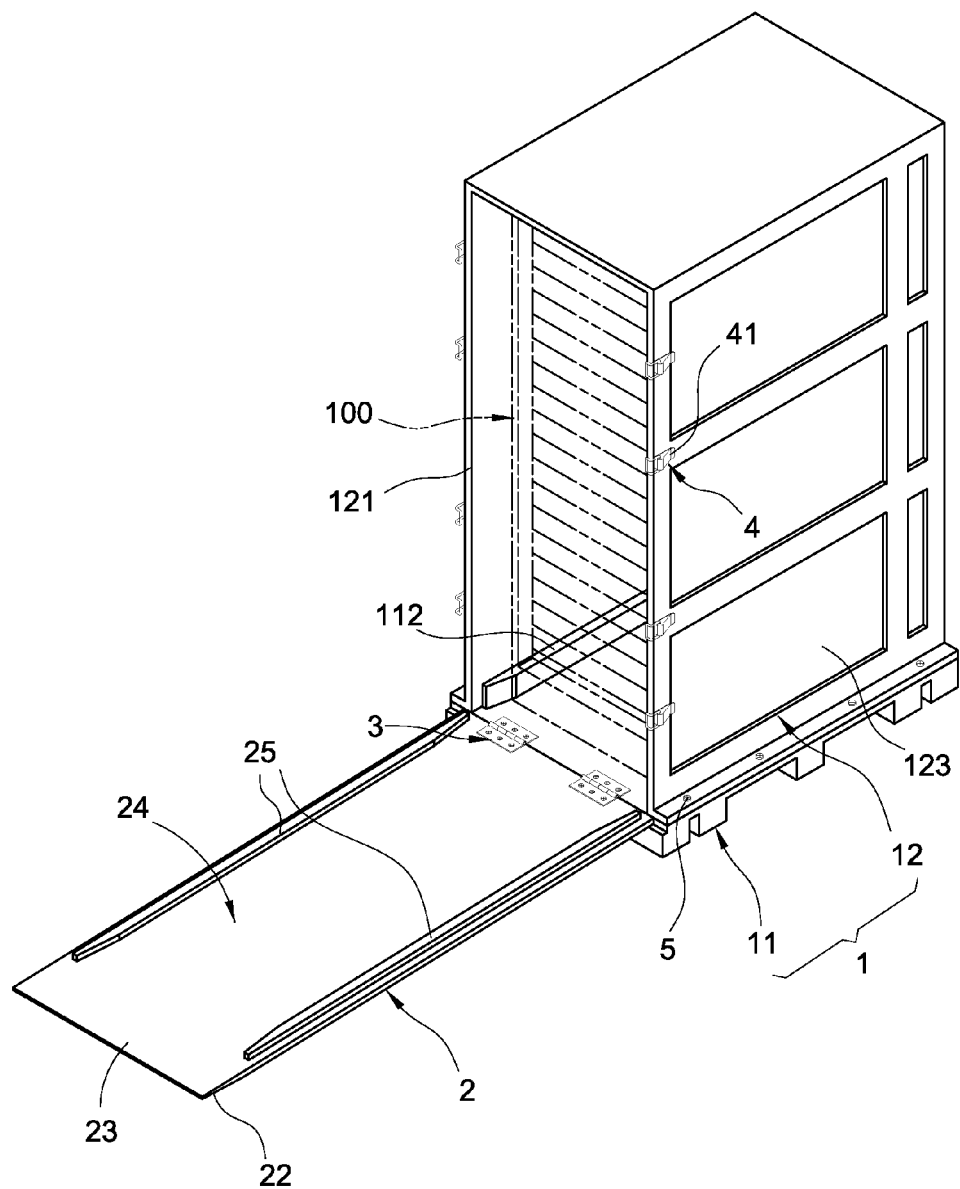
FIG. 5 is an illustration showing another state of use of the modular protective housing structure of the present invention.

Please refer to FIG. 4 to FIG. 5, showing the states of the uses of the modular protective housing structure 10 of the present invention. First, when the front door panel 2 is placed on the ground, with the arrangement of the slanted ribs 21 extended from the front door panel 2 and attached to the ground, a slanted board is formed at the front door panel 2 bridging between the ground and the base 11 in order to allow the rack 100 to slide into the chassis 1 along the front door panel 2, and the rack 100 is pushed into the positioning protruded strip 112 for securement. Accordingly, by using the front door panel 2 to replace the known slanted board additionally required for shipping, the customer purchasing a multiple number of servers or industrial computers can be prevented from receiving a multiple number of slanted boards in order to achieve the effect of cost saving.

In addition, as shown in FIG. 4, the positions of the slanted ribs 21 are arranged corresponding to the positions of the rollers 101 such that when the rack 100 is allowed to slide on the front door panel 2, the positions of the rollers 101 are on top of the positions of the slanted ribs 21 in exact in order to allow the slanted ribs 21 to firmly support the weight of the rack 100 such that the supporting ability of the front door panel 2 is increased.

Figure 2:
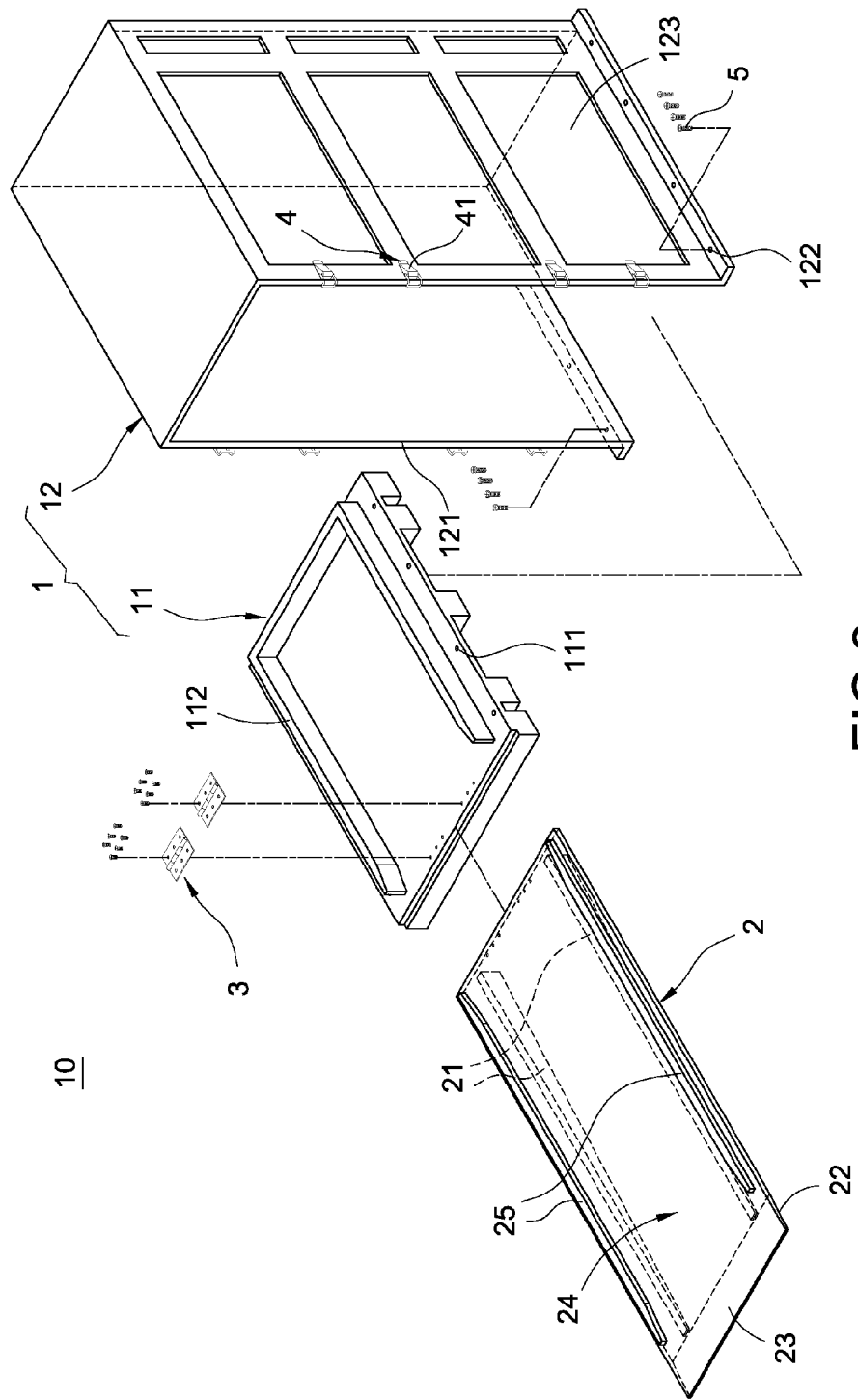
FIG. 2 is a perspective exploded view of a modular protective housing structure of the present invention.
Figure 3:
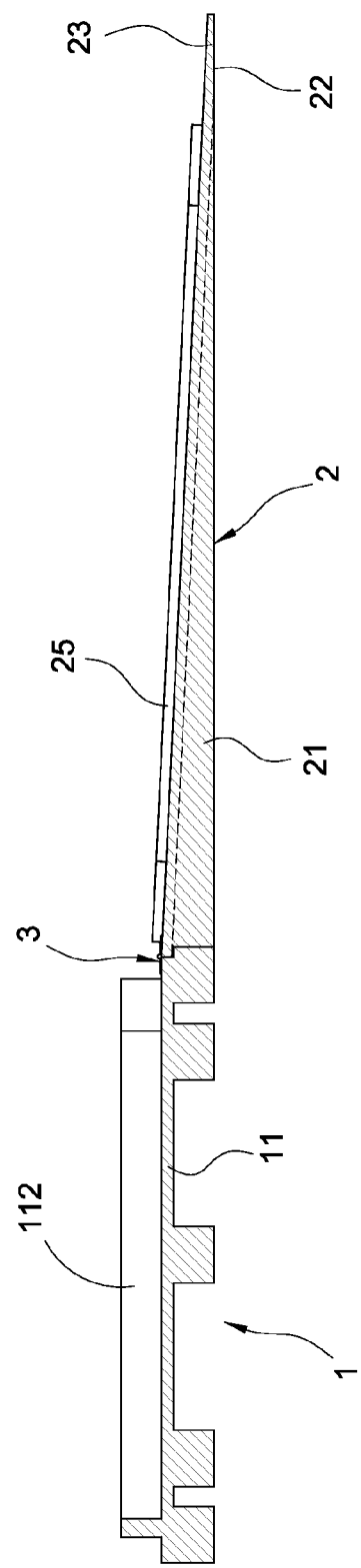
FIG. 3 is a cross sectional view of a modular protective housing structure of the present invention.

Furthermore, as shown in FIG. 2, the outer cover 12 includes a plurality of side plates 123, and the base 11 includes a positioning protruded strip 112 cooperating with the side plate 123. When the outer cover 12 is closed from the rear of the base 11 toward the front along the two sides of the positioning protruded strip 112, each slide plate 123 is blocked and positioned by the positioning protruded strip 112, and the outer cover 12 is secured onto the base 11 via the fastening method in order to allow the outer cover 12 to be more firmly installed on the base 11.

Also, the modular protective housing structure 10 further comprises a plurality of latch assemblies 4; each latch assembly 4 comprises a latch ring 41 and a latch hook 42. Each latch ring 41 is secured onto the outer cover 12, and each latch hook 42 is secured onto the front door panel 2. Each latch ring 41 is able to latch onto each latch hook 42 with each other in order to allow the front door panel 2 and the outer cover 12 to close onto each other via a latch method.

Moreover, the rear end of the front door panel 2 includes a flat surface 22 capable of attaching to the ground. Each slanted rib 21 is configured between the base 11 and the flat surface 22. Since the flat surface 22 is attached to the ground in order to increase the surface area of the front door panel 2 attaching to the ground, the weight of the rack 100 can be uniformly distributed to the ground via the surface area of the front door panel 2 attaching to the ground.

Figure 6:
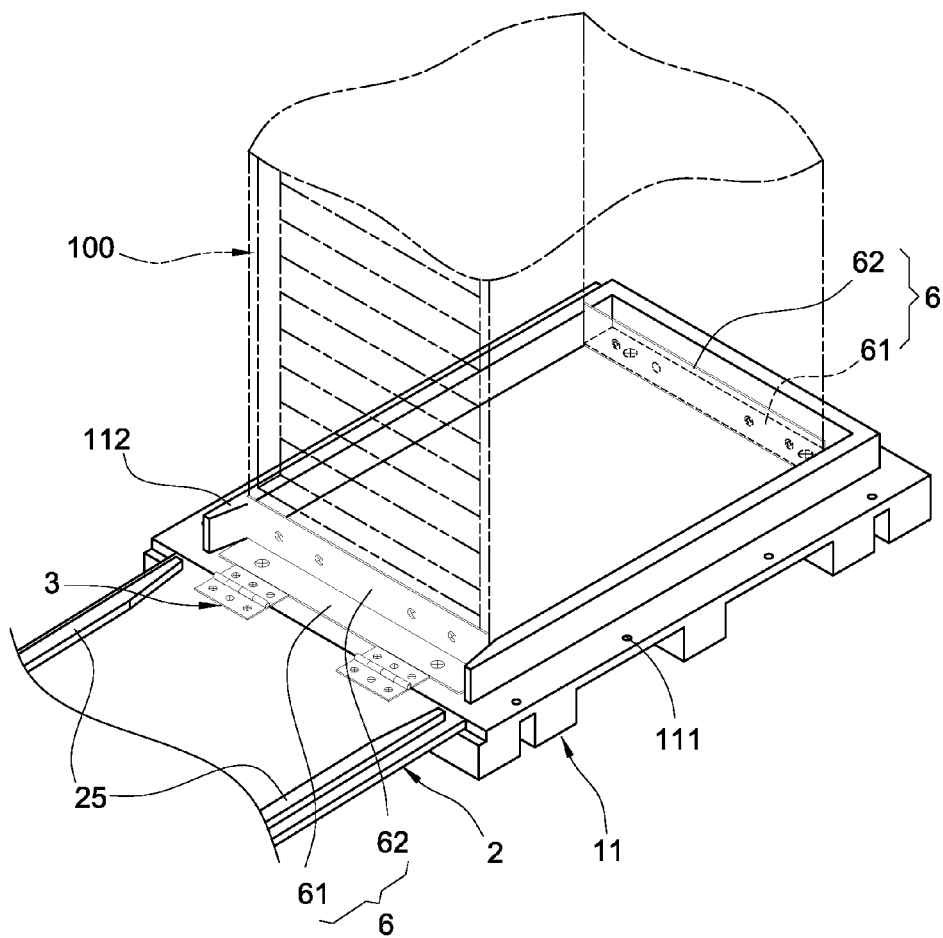
FIG. 6 is a perspective assembly view of another embodiment of a modular protective housing structure of the present invention.

Please refer to FIG. 6, it shows another embodiment of a modular protective housing structure 10 of the present invention. The embodiment of FIG. 6 is substantially identical to the embodiment shown in FIG. 1 to FIG. 5. The embodiment of FIG. 6 differs from the embodiment of FIG.

1 to FIG. 5 in that the modular protective housing structure 10 further comprises one or a plurality of anti-tipping plates 6.

The following provides further details. The quantity of the anti-tipping plate 6 of the present embodiment is two. The two anti-tipping plates 6 are arranged at the front side and the rear side of the rack 100 respectively; however, the present invention is not limited to such configuration only.

Each anti-tipping plate 6 includes a horizontal section 61 and a vertical section 62 vertically extended from one side of the horizontal section 61 in order to allow each anti-tipping plate 6 to form an L-shape plate. Each horizontal section 61 is secured onto the base 11, and each vertical section 62 is secured onto the rack 100 in order to allow the rack 100 to be firmly secured onto the base 11 such that the occurrences of tipping over and collisions of the rack 100 during the shipping thereof can be prevented.

In view of the above, the modular protective housing structure of the present invention is able to achieve the objectives expected while overcoming the drawbacks of the prior arts. The present invention is of industrial applicability, novelty and inventive step such that it complies with the patentability requirements and is applied legitimately in the application in light of the grant of the patent right.

What is claimed is:

1. A modular protective housing structure and a rack, the module protective housing structure and the rack comprising:

a chassis comprising a base and an outer cover configured to surround the base thereon; the outer cover having a front opening, a top plate, a back plate, and two side plates;

a front door panel pivotally attached to the base; the front door panel configured to cover onto the front opening and being adapted to be placed on a ground; the front door panel having a plurality of slanted ribs being adapted to contact the ground; and the rack having a plurality of rollers installed on a bottom thereof;

wherein the base further includes an U-shaped positioning protruded strip extended from the base; the outer cover covers the U-shaped positioning protruded strip and is positioned by the U-shaped positioning protruded strip; each of the two side plates of the outer cover bends to form a horizontal plate extending along the base;

wherein the base includes a plurality of first fixation holes; each of the two side plates includes a plurality of second fixation holes corresponding to the plurality of first fixation holes; each horizontal plate is fixed to the base by screwing a plurality of screws into the plurality of first fixation holes and the plurality of second fixation holes;

wherein a rear end of the front door panel includes a flat surface for being adapted to contact the ground; each one of the slanted ribs is configured between the base and the flat surface;

wherein when the front door panel is adapted to be placed on the ground, the rack is capable of sliding into the chassis by the plurality of rollers sliding on a path on the front door panel, and the plurality of slanted ribs are arranged right below the path.

2. The modular protective housing structure and the rack according to claim 1, wherein a thickness of each one of the slanted ribs gradually decreases toward a direction away from the base.

3. The modular protective housing structure and the rack according to claim 1, wherein the rear end of the front door panel includes slanted section having a thickness gradually decreases toward a direction away from the base; the flat surface is formed on the slanted section.

4. The modular protective housing structure and the rack according to claim 1, further comprising a plurality of hinge members; each one of the hinge members includes one end connected to the base and another end connected to the front door panel.

5. The modular protective housing structure and the rack according to claim 1, further comprising a plurality of latch assemblies; each one of the latch assemblies comprises a latch ring and a latch hook; each one of the latch ring is secured onto the outer cover; each one of the latch hook is secured onto the front door panel; each one of the latch ring and each one of the latch hook are latched onto each other.

6. The modular protective housing structure and the rack according to claim 1, wherein one side of the front door panel away from the plurality of slanted ribs includes a track; the rack slides on the track.

7. The modular protective housing structure and the rack according to claim 6, wherein the track comprises two guiding ribs extended from the front door panel, and the two guiding ribs keep the rollers of the rack sliding right above the corresponding slanted rib.

* * * * *